(12) United States Patent
Rupp et al.

(10) Patent No.: US 10,002,930 B2
(45) Date of Patent: Jun. 19, 2018

(54) FORMING A CONTACT LAYER ON A SEMICONDUCTOR BODY

(71) Applicant: Infineon Technologies AG, Neubiberg (DE)

(72) Inventors: Roland Rupp, Lauf (DE); Jens Peter Konrath, Villach (AT); Francisco Javier Santos Rodriguez, Villach (AT); Carsten Schaeffer, Annenheim (AT); Hans-Joachim Schulze, Taufkirchen (DE); Werner Schustereder, Villach (AT); Guenther Wellenzohn, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/365,627

(22) Filed: Nov. 30, 2016

(65) Prior Publication Data
US 2017/0162390 A1 Jun. 8, 2017

(30) Foreign Application Priority Data
Dec. 1, 2015 (DE) .......................... 10 2015 120 848

(51) Int. Cl.
*H01L 29/45* (2006.01)
*H01L 21/28* (2006.01)
(Continued)

(52) U.S. Cl.
CPC ...... *H01L 29/401* (2013.01); *H01L 21/02697* (2013.01); *H01L 21/0485* (2013.01);
(Continued)

(58) Field of Classification Search
CPC ............. H01L 21/0485; H01L 21/0495; H01L 21/02697; H01L 21/2258; H01L 29/401;
(Continued)

(56) References Cited

U.S. PATENT DOCUMENTS

| 3,562,022 A * | 2/1971 | Shifrin .............. H01L 21/26526 |
| | | 257/E21.338 |
| 3,600,797 A * | 8/1971 | Bower .................... H01L 21/00 |
| | | 148/DIG. 122 |

(Continued)

FOREIGN PATENT DOCUMENTS

DE 102010063806 A1 6/2011
JP S5972181 A 4/1934

(Continued)

OTHER PUBLICATIONS

Silicon carbide, Wikipedia, The Free Ecncyclopedia, Nov. 6, 2015.*

*Primary Examiner* — Robert Bachner
*Assistant Examiner* — Molly Reida
(74) *Attorney, Agent, or Firm* — Murphy, Bilak & Homiller, PLLC

(57) ABSTRACT

Disclosed is a method. The method includes forming a metal layer on a first surface of a semiconductor body; irradiating the metal layer with particles to move metal atoms from the metal layer into the semiconductor body and form a metal atom containing region in the semiconductor body; and annealing the semiconductor body. The annealing includes heating at least the metal atom containing region to a temperature of less than 500° C.

22 Claims, 4 Drawing Sheets

(51) Int. Cl.
*H01L 29/40* (2006.01)
*H01L 21/02* (2006.01)
*H01L 21/04* (2006.01)
*H01L 21/225* (2006.01)
*H01L 29/47* (2006.01)
*H01L 29/16* (2006.01)
*H01L 21/285* (2006.01)
*H01L 29/20* (2006.01)

(52) U.S. Cl.
CPC ...... *H01L 21/0495* (2013.01); *H01L 21/2258* (2013.01); *H01L 29/1608* (2013.01); *H01L 29/45* (2013.01); *H01L 29/452* (2013.01); *H01L 29/47* (2013.01); *H01L 21/046* (2013.01); *H01L 21/28575* (2013.01); *H01L 29/20* (2013.01)

(58) Field of Classification Search
CPC ....... H01L 29/45; H01L 29/452; H01L 29/47; H01L 29/475
USPC ....... 438/597, 602, 604, 606, 659, 660, 682, 438/571
See application file for complete search history.

(56) References Cited

U.S. PATENT DOCUMENTS

| | | | |
|---|---|---|---|
| 3,887,994 A * | 6/1975 | Ku | H01L 21/31055 257/734 |
| 4,551,908 A | 11/1985 | Nagasawa et al. | |
| 6,365,446 B1 * | 4/2002 | Chong | H01L 21/2652 257/E21.165 |
| 9,111,985 B1 * | 8/2015 | Roy | H01L 29/73 |
| 2002/0098689 A1 | 7/2002 | Chong et al. | |
| 2011/0151654 A1 * | 6/2011 | Konishi | H01L 21/0465 438/530 |

FOREIGN PATENT DOCUMENTS

| | | |
|---|---|---|
| JP | S59177926 A | 10/1984 |
| JP | S625635 A | 1/1987 |
| JP | S62166512 A | 7/1987 |
| JP | 2001135591 A | 5/2001 |
| JP | 2009545885 A | 12/2009 |
| JP | S60153121 A | 12/2009 |
| JP | 2013058602 A | 3/2013 |
| JP | 2013183050 A | 9/2013 |

* cited by examiner

FORMING A CONTACT LAYER ON A SEMICONDUCTOR BODY

TECHNICAL FIELD

This disclosure in general relates to forming a contact layer on a semiconductor body. In particular, the disclosure relates to forming a contact layer that forms an ohmic contact with a semiconductor body.

BACKGROUND

Semiconductor device such as diodes, transistors, or thyristors, to name only some, include doped semiconductor regions in a semiconductor body. Some types of these semiconductor regions such as, for example, emitter regions in a diode, source and drain regions in a transistor device, or collector and emitter regions in a thyristor are connected to contact layers that make it possible for the device to be interconnected with other devices, a printed circuit board, or the like. Those contact layers are ohmically connected to the respective semiconductor regions. "Ohmically connected" means that there is no rectifying junction between the contact layer and the respective semiconductor region.

Forming a metal layer on a semiconductor body may include depositing a metal layer on a surface of the semiconductor body, and heating the metal layer and the semiconductor body to a temperature of about 980° C. or higher. Such high temperatures, however, may not be compatible with processes in the manufacturing process. There is therefore a need to form a contact layer that is in ohmic contact with the semiconductor body at lower temperatures.

SUMMARY

One embodiment relates to a method. The method includes forming a metal layer on a first surface of a semiconductor body, irradiating the metal layer with particles so as to move metal atoms from the metal layer into the semiconductor body and form a metal atom containing region in the semiconductor body. The method further includes annealing the semiconductor body, wherein the annealing comprises heating at least the metal atom containing region to a temperature of less than 500° C.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1A:
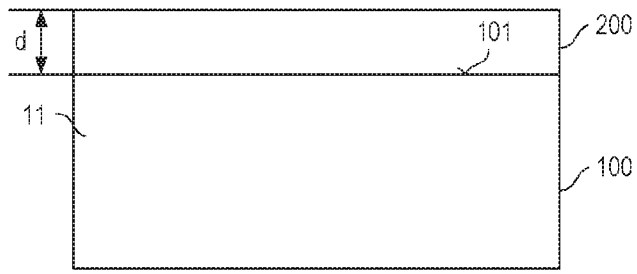
FIGS. 1A-1E illustrate one example of a method for producing a contact layer on a surface of a semiconductor body.
Figure 1B:
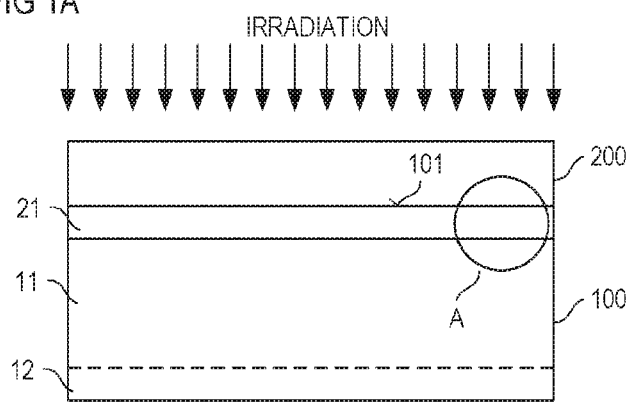
Figure 1C:
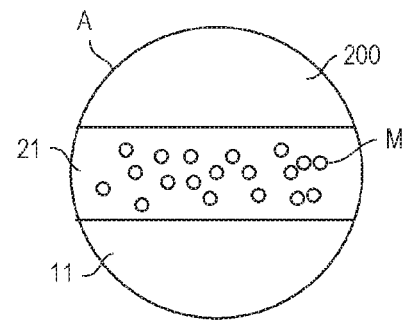
Figure 1D:
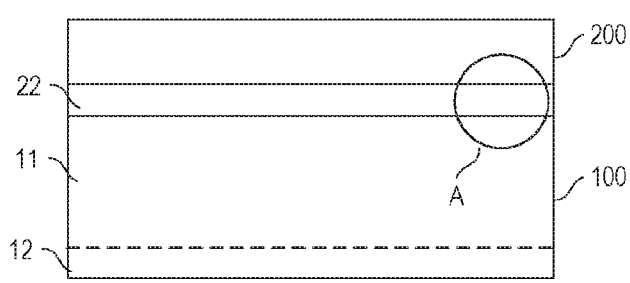
Figure 1E:
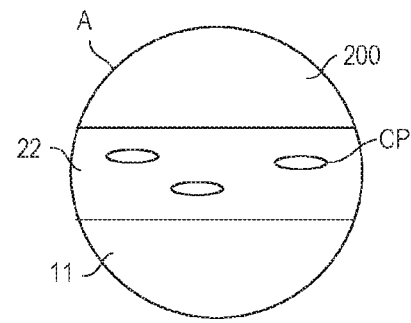

FIG. 1A-1E illustrate one example of a method for a contact layer that is in ohmic contact with a semiconductor body 100. An "ohmic contact" means that there is no rectifying junction between the contact layer 200 and the semiconductor body 100. FIGS. 1A, 1B and 1D show vertical cross sectional views of a section of the semiconductor body 100 at different stages of the method. FIGS. 1C and 1E show details of the structures shown in FIGS. 1B and 1D, respectively. A "vertical cross sectional view" is a view in a section plane that extends perpendicular to the first surface 101 of the semiconductor body 100. It should be noted that FIGS. 1A, 1B and 1E only show a section of the semiconductor body 100. That is, the semiconductor body 100 may extend farther in a vertical direction, which is a direction perpendicular to the first surface 101, and in lateral directions, which are directions parallel to the first surface 101. According to one example, the process sequence explained with reference to FIGS. 1A-1E is applied to a semiconductor wafer that includes a plurality of semiconductor bodies (dies) and that can be subdivided into in the individual semiconductor bodies after the process sequence.

According to one example, the semiconductor body 100 includes a wide-bandgap semiconductor material. A wide-bandgap semiconductor material has a bandgap of more than 2 eV (electron volts). Examples of a high bandgap semiconductor material include silicon carbide (SiC), gallium nitride (GaN), indium gallium nitride (InGaN), or diamond. According to one example, the semiconductor material is SiC. According to one example, the SiC has the 4H, 6H, 3C or 15R polytype, to name only a few of a plurality of suitable SiC polytypes.

According to another example, the semiconductor body 100 includes gallium arsenide (GaAs).

Referring to FIG. 1A, the method includes forming a metal layer 200 on the first surface 101 of the semiconductor body 100. Forming the metal layer 200 may include depositing the metal layer 200 on the first surface 101. The metal layer 200 includes at least one metal, so that the metal layer may include a pure metal or a metal alloy including two or more different types of metal. According to one example, the at least one metal included in the metal layer 200 is a silicide forming metal. A "silicide forming metal" is a metal that is suitable to form a silicide together with silicon (Si) included in the semiconductor body 100. Examples of those silicide forming metals include nickel (Ni), molybdenum (Mo), iron (Fe), chromium (Cr), aluminum (Al), titanium (Ti). Examples of silicide forming metal alloys include titanium-aluminum (TiAl) and nickel-aluminum (NiAl).

According to one example, the metal layer 200 is formed to have a thickness d that is selected from a range of between 5 nanometers (nm) and 200 nanometers (nm), in particular between 10 nanometers (nm) and 100 nanometers (nm). The "thickness d" of the metal layer 200 is the dimension of the metal layer 200 in a direction perpendicular to the first surface 101.

Referring to FIG. 1B, the method further includes irradiating the metal layer 200 with particles. Irradiating the metal layer 200 with particles includes introducing the particles into the metal layer 200 such that those particles collide with metal atoms inside the metal layer 200 and move metal atoms from the metal layer 200 into the semiconductor body 100 so as to form a metal atom containing region 21 in the semiconductor body 100. This metal atom containing region 21 is referred to as mixed region 21 in the following.

FIG. 1c schematically illustrates an enlarged cross sectional view of the mixed region 21 that includes metal atoms M that were moved from the metal layer 200 into the semiconductor body 100. It should be noted that FIG. 1C is only a schematic view intended to illustrate the principle of moving metal atoms from the metal layer 200 into the semiconductor body 100. In FIG. 1C, neither the metal atoms included in the metal layer 200 nor the particles that were irradiated into the metal layer 200 are illustrated. Those particles may end up in the mixed region 21 or deeper in the semiconductor body 100. "Deeper" means more distant to the first surface 101 than the vertical dimension of the mixed region 21. The vertical dimension of the mixed region 21 is the dimension in a direction perpendicular to the first surface 101.

According to one example, the particles are ions and the method of irradiating the particles into the metal layer 200 includes an ion implantation process. Different types of ions may be used in this implantation process. According to one example, the implanted ions are noble gas ions such as, for example, helium (He) ions or krypton (Kr) ions. Those noble gas ions only serve to move (push) metal atoms from the metal layer 200 into the semiconductor body 100. When ending up in the semiconductor body 100 those noble gas ions neither chemically react with the atoms in the crystal lattice of the semiconductor body 100 (which are silicon and carbon atoms in case of an SiC semiconductor body) nor become chemically bound in the crystal lattice of the semiconductor body 100. According to another example, the implanted ions are hydrogen ions (protons).

According to one example, the implanted ions are isoelectric ions, such as, for example, silicon (Si) or germanium (Ge) ions. In this context, "isoelectric" means that the particles have the same number of valence electrons as silicon so that they do not act as dopants. Those isoelectric ions, when penetrating into the semiconductor body 100, may be incorporated into the crystal lattice of the semiconductor body 100 in an annealing process that is explained in further detail herein below.

According to one example, the implanted ions are metal ions. In particular, those metal ions may be ions from a silicide forming metal. Those ions can be ions of the same type of metal that is included in the metal layer 200, or can be ions of a type of metal that is different from the type of metal included in the metal layer 200. Using metal ions from a silicide forming metal has the effect that the mixed region 21 not only includes metal atoms that were moved from the metal layer 200 into the semiconductor body 100, but also the metal atoms that were implanted through the metal layer 200 into the semiconductor body 100. By this, the amount of metal atoms M in the mixed region 21 can be increased as compared to an implantation process that uses non-metal ions.

According to yet another example, carbon (C) ions are implanted in the implantation process. Those carbon ions, when ending up in the semiconductor body 100, may promote the formation of carbon precipitates. Such formation of carbon precipitates is explained in further detail herein below.

The implantation process is not restricted to use only one of the ion types explained above. According to one example, two or more implantation processes with different types of ions are performed in order to push metal atoms M from the metal layer 200 into the semiconductor body 100.

An implantation energy of the implanted ions is, inter alia, dependent on the thickness d of the metal layer 200. In general, the required implantation energy increases as the thickness d of the metal layer 200 increases. The implantation energy is chosen such that the implanted ions are capable of pushing metal atoms M from the metal layer into the semiconductor body 100 and ending up in the semiconductor body 100. According to one example, an implantation energy is selected such that a distance between the first surface 101 of the semiconductor body 100 and an end of range of the implanted particles is selected from between 50% and 200%, between 60% and 120%, or between 70% and 100% of the thickness d of the metal layer. The "end of range" is defined by the maximum depth (as seen from the first surface 101) the particles reach in the semiconductor body 100. Basically, the higher the implantation energy at a given metal layer 20 thickness d the deeper the particles are implanted, and the larger the metal layer 20 thickness at a given implantation energy the less deep the particles are implanted.

Referring to FIG. 1D, the method further includes an annealing process in which at least the mixed region 22 is heated to an annealing temperature for a predefined time period. The annealing temperature is below 500° C. According to one example, the annealing temperature is selected from a range of between 350° C. and 500° C. For example, the predefined time period is selected from a range of between 30 seconds and 30 minutes. In this annealing process, silicon atoms from the semiconductor body 100 in the mixed region 21 and the metal atoms M introduced into the mixed region 21 form a silicide layer 22 adjoining the metal layer 200. Furthermore, the carbon atoms from the semiconductor body 100 in the mixed region 21 form carbon precipitates CP in the silicide layer 22. This is schematically illustrated in FIG. 1E which shows an enlarged view of one section of the silicide layer 22. Introducing carbon atoms into the mixed region 21 in the implantation process explained with reference to FIG. 1B may promote such formation of carbon precipitates CP in the annealing process. In the annealing process, the metal atoms M in the mixed region 21 may diffuse towards the first surface 101 so that the silicide layer 22 essentially forms along the metal layer 200. Thus, a thickness of the silicide layer 22 can be smaller than a thickness of the mixed region 21. The thickness of these regions 21, 22 is their dimension in the vertical direction of the semiconductor body 100. The silicide layer 22 provides for an ohmic contact between the metal layer 200 that adjoins the silicide layer 22 on one side and the semiconductor body 100 that adjoins the silicide layer 22 on the other side, wherein the silicide layer 22 has been formed by metal atoms from the metal layer 200 and silicon atoms from the semiconductor body 100.

Forming the silicide layer 22 in the annealing process requires a sufficient concentration of metal atoms M in the mixed region. If, for example, the metal layer 200 is a nickel layer so that the silicide layer includes nickel-silicide, which has the chemical formula $NiSi_2$, one nickel atom and two silicon atoms are required to form one silicide molecule. The concentration of metal atoms in the mixed region can be adjusted by the implantation dose and the implantation energy in the implantation process, wherein the metal concentration increases as the implantation dose increases. For example, the implantation dose is selected from a range of between $1E16$ $cm^{-2}$ and $1E18$ $cm^{-2}$, in particular between $1E17$ $cm^{-2}$ and $1E18$ $cm^{-2}$.

In the process explained above, the metal atoms that become part of the silicide layer 22 are introduced into the semiconductor body 100 by the implantation process explained with reference to FIG. 1B. In the annealing process explained with reference to FIG. 1D, the silicide layer 22 can be formed at relatively low annealing temperatures of below 500° C. The reason is that due to the implantation process the crystal lattice of the semiconductor body 100 in the mixed region is heavily damaged so that bonds between the atoms in the crystal lattice are broken up. This makes the silicon atoms very reactive and supports the formation of the silicide. In a conventional process, metal atoms are introduced into the semiconductor body by a diffusion process that requires temperatures of more than 900° C. and, therefore, significantly higher temperatures than the process explained with reference to FIGS. 1A-1E herein above.

Referring to FIGS. 1A-1E, the semiconductor body 100 includes a doped region 11 that adjoins the metal layer 200 before the implantation and annealing process and the silicide layer 22 after the annealing process. According to one example, a doping concentration of this doped region 11 is selected from a range of between $2E17$ $cm^{-3}$ and $2E20$ $cm^{-3}$, in particular from a range of $5E17$ $cm^{-3}$ and $5E19$ $cm^{-3}$. This doped region 11 can be an n-type region or a p-type region. According to one example, the doped region 11 is an n-type region and the metal layer includes at least one of Ni, Mo, Fe or Cr. According to another example, the doped region 11 is a p-type region and the metal layer 200 includes at least one of Al, Ti, or Ni. The doped region 11 can be formed using a conventional doping process before forming the metal layer 200 on the first surface 101 of the semiconductor body 100.

According to one example, additionally to forming the doped region 11 before forming the metal layer 200 dopant atoms are introduced into the semiconductor body 100 in the implantation process shown in FIG. 1B. In this case, at least one type of the implanted ions are dopant ions. Dependent on the desired doping type of the doped region 11, these dopant ions are n-type or p-type dopant ions. In SiC, one example of an n-type dopant is nitrogen (N), and one example of a p-type dopant is aluminium (Al). These dopant atoms end up in the semiconductor body 100 in the implantation process. In the annealing process, these dopant atoms are electrically activated by being incorporated into the crystal lattice at least in a region adjoining the silicide layer. Thus, these dopant atoms may increase the doping concentration of the doped region 11 in a region adjoining the silicide layer 22 and therefore may help to reduce the electrical resistance between the silicide layer 22 and the doped region.

According to another example, dopants are introduced into the semiconductor body 100 from the metal layer 200. In this case, the metal layer 200 is formed to include dopant atoms and these dopant atoms are introduced into the semiconductor body from the metal layer 200 by the implantation process together with the silicide forming metal atoms from the metal layer 200. Forming the metal layer 200 to include dopant atoms may include depositing the metal layer 200 in an atmosphere that includes dopant atoms. For example, forming the metal layer 200 may include depositing the metal layer in a nitrogen ($N_2$) atmosphere or a TMA (trimethylaluminum) atmosphere. In the first example, the metal layer 200 includes nitrogen as an n-type dopant. In the second example, the metal layer 200 includes aluminium as a p-type dopant. An aluminium containing metal layer 200 may also be obtained by forming the metal layer 200 as an aluminium containing alloy such as NiAl using a conventional deposition process.

Figure 2:
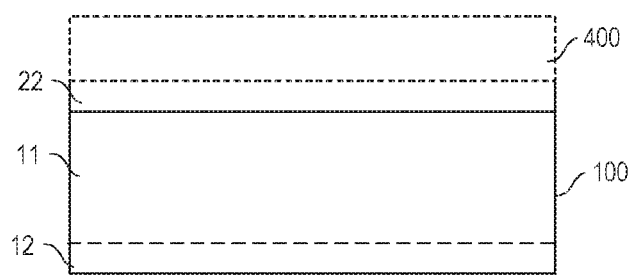
FIG. 2 shows the arrangement shown in FIG. 1E after a further process step.

According to one example, the metal layer 200 is removed after the annealing process so that only the silicide layer 22 remains as a contact layer on the semiconductor body 100. The result of removing the metal layer 200 is shown in FIG. 2. The metal layer 200 can be removed in an etching process that etches the metal layer 200 selectively to the silicide layer 22, so that the silicide layer 22 acts as an etch stop layer in this etching process. According to one example (illustrated in dashed lines in FIG. 2) a further metal layer 400 is formed on the silicide layer 22 after removing metal layer 200. The further metal layer 400 can be of the same type or a different type as the metal layer 200. The "type" of the metal layer is defined by the type of metal(s) included in the respective metal layer.

FIGS. 3A-3D show a modification of the method shown in FIGS. 1A-1E. In this method, referring to FIG. 3A, the implantation process includes using an implantation mask 300. The implantation mask covers parts of the metal layer 200 and includes an opening 301 so that particles (ions) are implanted through the opening 301 only into those parts of the metal layer 200 uncovered by the implantation mask 300. Consequently, a form and dimension of the mixed region 21 is essentially given by the form and dimension of the opening 301 in the implantation mask 300.

Figure 3A:
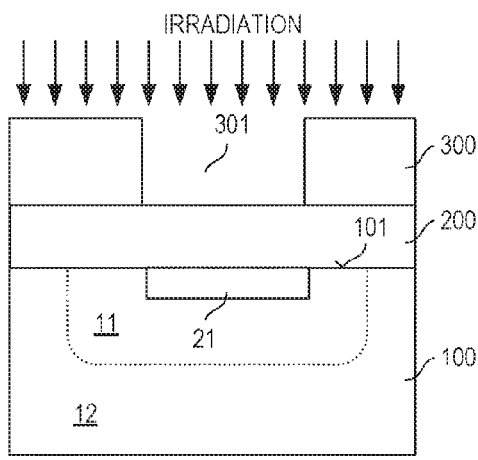
FIGS. 3A-3D illustrate a modification of the method shown in FIGS. 1A-1E.
Figure 3D:
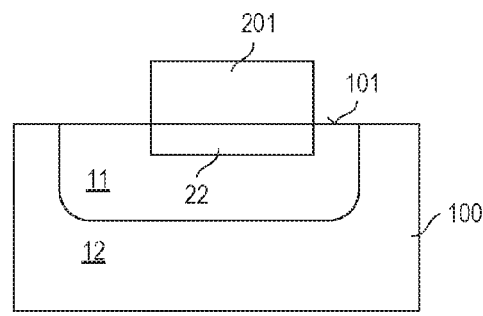
Figure 3B:
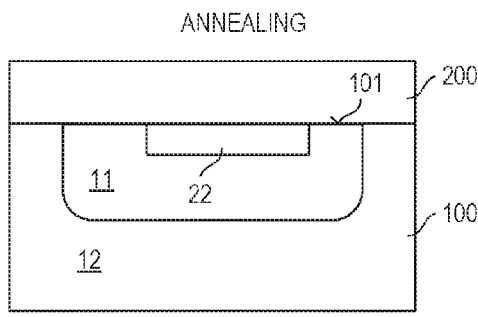

In the annealing process, which is shown in FIG. 3B, the silicide layer 22 is formed from metal atoms and silicon atoms in the mixed region 21. Form and dimension of the silicide layer 22 in lateral directions of the semiconductor body 100 is essentially given by the form and dimension of the mixed region 22 and, therefore, the form and dimension of the opening 301 in the implantation mask 300.

Figure 3C:
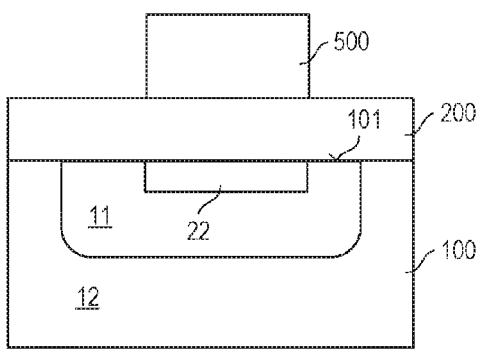

After the annealing process, the metal layer 200 may be removed in the way explained with reference to FIG. 2 above. Alternatively, as shown in FIGS. 3C and 3D, the metal layer 200 is removed only in those sections where the metal layer 200 does not cover (adjoin) the silicide layer 22. This may include forming an etch mask 500 (see FIG. 3C) on the metal layer 200, and removing the metal layer 200 in those regions not covered by the etch mask 400. The result of this is shown in FIG. 3D where 201 denotes the remaining section of the metal layer 200 after the removing (etching) process.

Figure 4A:
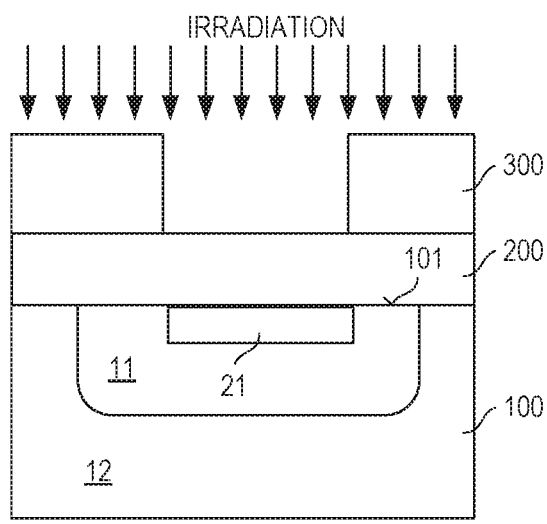
FIG. 4A-4C illustrate another of the method shown in FIGS. 1A-1E.
Figure 4B:
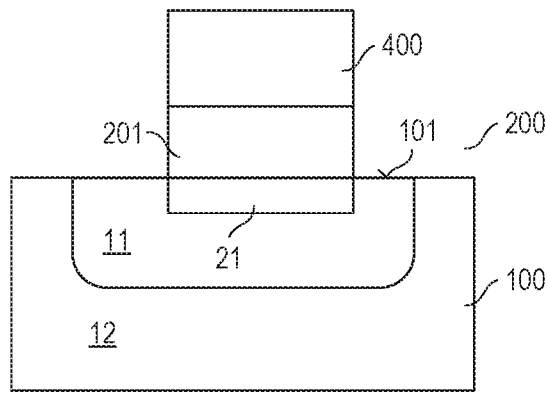
Figure 4C:
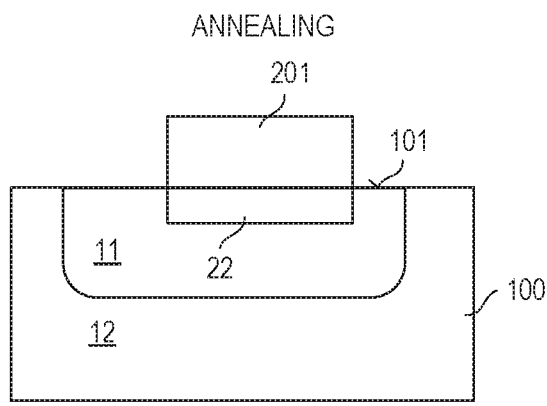

FIGS. 4A-4C show a modification of the method shown in FIGS. 3A-3D. In this method, after forming the mixed region 21 as shown in FIG. 4A, the metal layer 200 is structured by removing those sections of the metal layer 200 that do not cover (adjoin) the mixed region 21. FIG. 4B shows the remaining sections 201 of the metal layer 200, with the etch mask 400 still in place. Referring to FIG. 4C, the annealing process, in which the silicide layer 22 is formed, follows structuring the metal layer 200 and removing the etch mask 400.

The arrangement explained herein above with the doped region 11, the silicide layer 22 in ohmic contact with the doped region 11, and the optional metal layer 200 can be used in a plurality of different types of semiconductor devices. Three examples of those semiconductor devices and examples of where such an arrangement may be used in those semiconductor devices are explained with reference to FIGS. 5-7 herein below. Of course, the structure is not limited to be used in those semiconductor devices, but may be used in other semiconductor devices as well.

Figure 5:
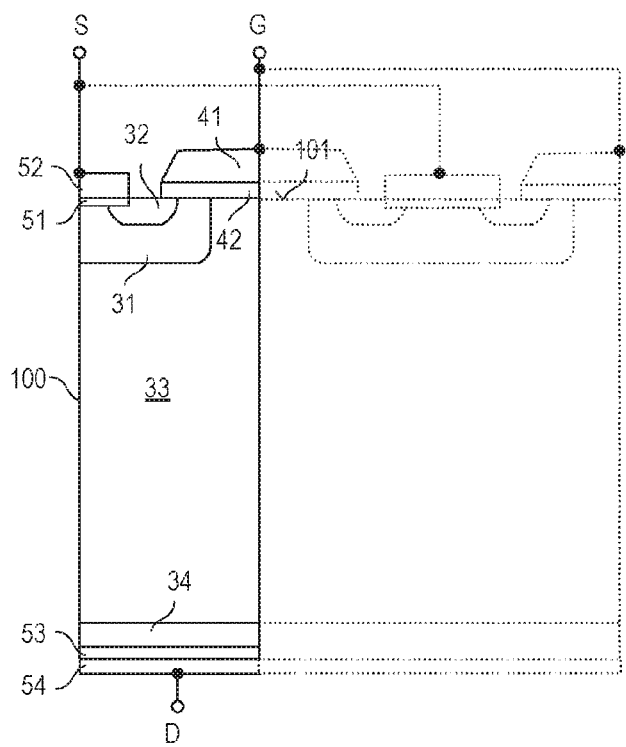
FIG. 5 show a vertical cross sectional view of a transistor device according to one example.

FIG. 5 shows a vertical cross sectional view of one section of a transistor device, in particular a transistor device with an insulated gate electrode. FIG. 5 shows one transistor cell of such transistor device. The transistor device may include a plurality of those transistor devices connected in parallel. Two more of these transistor cells are illustrated in dotted lines in FIG. 5. The transistor device includes a body region 31, a source region 32 in the body region 31, and a drift region 33. The body region 31 separates the source region 32 from the drift region 33. A gate electrode 41 is adjacent the body region 31 and is dielectrically insulated from the body region 31 by a gate dielectric 42. The drift region 33 is arranged between the body region 31 and a drain region 34. Optionally (not shown) a field stop region is arranged between the drain region 34 and the drift region 33. The transistor device can be an n-type transistor device or a p-type transistor device. In an n-type transistor device, the source region 32 and the drift region 33 are n-doped and the body region 31 is p-doped. In a p-type transistor device, the individual device regions have a doping type complementary to the doping type of the respective device regions in an n-type transistor device. The transistor device can be a MOSFET (Metal Oxide Semiconductor Field-Effect Transistor). In this case, the drain region 34 has the same doping type as the drift region 33. According to another example, the transistor device is an IGBT (Insulated Gate Bipolar Transistor). In this case, the drain region 34 has a doping type complementary to the doping type of the drift region 33.

The gate electrode 41 forms a gate node G or is electrically connected to a gate node of the transistor device. The source region 32 and the body regions 31 are electrically connected to a source node S of the transistor device through a silicide layer 51 and an optional electrode layer 52. The silicide layer 51 can be formed in accordance with the silicide layer 22 explained herein before, and the electrode layer 52 can be formed in accordance with the metal layer 200 explained herein before. The source region 32 and the body region 31 can be formed (in a conventional way) before forming the silicide layer 51.

Furthermore, the drain region 34 is electrically connected to a drain node D through a silicide layer 53 and an optional electrode layer 54. The silicide layer 53 can be formed in accordance with the silicide layer 22 explained herein before, and the electrode layer 54 can be formed in accordance with the metal layer 200 explained herein before.

Figure 6:
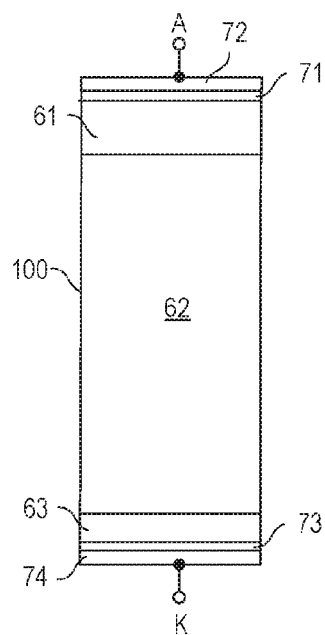
FIG. 6 shows a vertical cross sectional view of a bipolar diode according to one example.

FIG. 6 shows a vertical cross sectional view of a bipolar diode. The bipolar diode includes a first emitter region 61, a base region 62 and a second emitter region 63. A pn junction is formed between the first emitter region 61 and the base region 62. The base region 62 and the second emitter region 63 have the same doping type. The first emitter region 61 is connected to an anode node of the diode through a silicide layer 71 and an optional first electrode layer 72. The silicide layer 71 and the optional electrode layer 72 can be formed in accordance with the silicide layer 22 and the metal layer 200, respectively, explained herein before. Furthermore, the second emitter region 63 is connected to a cathode node K through a silicide layer 73 and an optional second electrode layer 74. The silicide layer 73 and the electrode layer 74 can be formed in accordance with the silicide layer 22 and the metal layer 200, respectively, explained herein before.

Figure 7:
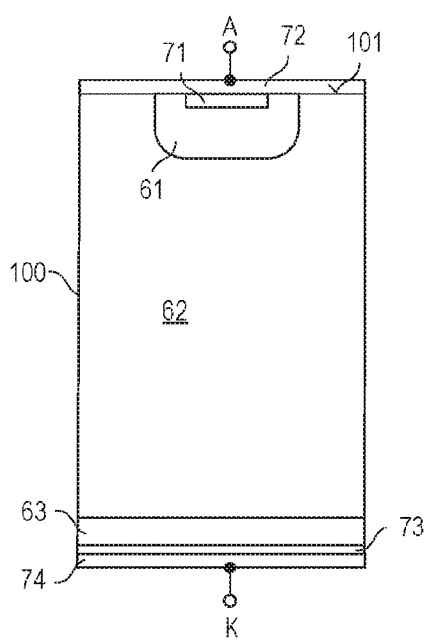
FIG. 7 shows a vertical cross sectional view of a merged bipolar Schottky diode.

FIG. 7 shows a vertical cross sectional view of a merged bipolar Schottky diode, which may also be referred to as merged PiN Schottky diode. The merged bipolar Schottky diode shown in FIG. 7 is based on the bipolar diode shown in FIG. 6 so that same parts have same reference characters. In this diode, the first emitter region 61 is p-doped, the base region 62 and the second emitter region 63 are n-doped. The first emitter region 61 is ohmically connected to the first electrode layer 72 via the silicide layer 71. Furthermore, the base region includes at least one section that is in contact with the first electrode layer 72, and a Schottky contact is formed between the first electrode layer 72 and the base region 62. Thus, the diode shown in FIG. 7 includes a bipolar diode and a Schottky diode connected in parallel.

The first electrode layer 72 includes a Schottky metal, which is a metal suitable to form a Schottky contact with the base region 62. According to one example, the base region 62 includes n-type SiC and the Schottky metal is configured to form a Schottky contact with a barrier height of between 0.7 eV and 1.6 eV on the n-type SiC. The term "Schottky metal" as used herein denotes any substance that is suitable to form a Schottky contact with a semiconductor material. Those substances may include pure metals such as titanium (Ti), molybdenum (Mo), nickel (Ni), or tantalum (Ta), or metal compounds such as molybdenum nitride (MoN) or titanium nitride (TiN). In the merged diode shown in FIG. 7, the silicide layer 71 can be formed as explained with reference to the silicide layer 22 shown in FIGS. 3A and 3B. According to one example, the first electrode layer is formed by removing the metal layer used to form the silicide layer (which is metal layer 200 shown in FIG. 3B), and forming the electrode layer 72 on the silicide layer 72 and those sections of the base region 62 extending to the first surface 101. According to another example, the metal layer used to form the silicide layer includes a Schottky metal. In this case, the metal layer may remain in place after forming the silicide layer 71, and the metal layer (200 in in FIG. 3B) forms the first electrode layer 72.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
    forming a metal layer on a first surface of a semiconductor body, the semiconductor body comprising a widebandgap semiconductor material having a bandgap of more than 2 eV;
    irradiating the metal layer with particles to move metal atoms from the metal layer into the semiconductor body and form a metal atom containing region in the semiconductor body; and
    annealing semiconductor body at an annealing temperature of less than 500° C., to form a silicide layer from the metal atoms moved into the metal atom containing region in the semiconductor body and from silicon atoms in the semiconductor body, and to form carbon precipitates in the silicide layer from carbon atoms in the semiconductor body.

2. The method of claim 1, wherein the annealing temperature is higher than 350° C.

3. The method of claim 1, wherein a duration of the annealing is in a range between 30 seconds and 30 minutes.

4. The method of claim 1, wherein the semiconductor body comprises a doped region in a region adjoining the first surface.

5. The method of claim 4, wherein a doping concentration of the doped region is in a range between $2E17$ $cm^{-3}$ and $2E20$ $cm^{-3}$.

6. The method of claim 1, wherein the particles comprise noble gas ions.

7. The method of claim 1, wherein the particles comprise one of semiconductor and metal ions.

8. The method of claim 1, wherein the particles comprise dopant ions.

9. The method of claim 8, wherein the semiconductor body comprises SiC and the dopant ions are selected from the group consisting of: aluminum ions; and nitrogen atoms.

10. The method of claim 1, wherein irradiating the metal layer comprises irradiating the metal layer with different types of particles.

11. The method of claim 1, further comprising:
removing the metal layer after the annealing.

12. The method of claim 11, further comprising:
forming a further metal layer on the first surface.

13. The method of claim 12, wherein the further metal layer comprises a Schottky metal.

14. The method of claim 13, wherein the Schottky metal is configured to form a Schottky contact with a barrier height of between 0.7 eV and 1.6 eV on n-type SiC.

15. The method of claim 13, wherein the Schottky metal is selected from the group consisting of: titanium (Ti); molybdenum (Mo); nickel (Ni); tantalum (Ta); molybdenum nitride (MoN); and titanium nitride (TiN).

16. The method of claim 1, wherein irradiating the metal layer with particles comprises using a mask that comprises an opening and partially covers the metal layer.

17. The method of claim 4, wherein the doped region is one of a source region and a drain region of a transistor device, or an emitter region of a bipolar diode or a merged bipolar Schottky diode.

18. The method of claim 1, further comprising:
implanting carbon atoms into the semiconductor body during the irradiating of the metal layer, to promote formation of the carbon precipitates during the annealing of the semiconductor body.

19. The method of claim 4, further comprising:
implanting dopant ions into the semiconductor body during the irradiating of the metal layer; and
electrically activating the dopant ions during the annealing of the semiconductor body, to increase the doping concentration of the doped region in a region adjoining the silicide layer.

20. The method of claim 16, further comprising:
after the annealing of the semiconductor body, removing the metal layer only in those sections where the metal layer does not cover the silicide layer.

21. The method of claim 16, further comprising:
before the annealing of the semiconductor body, removing sections of the metal layer that do not cover the metal atom containing region in the semiconductor body.

22. A method, comprising:
forming a metal layer on a first surface of a semiconductor body, the metal layer being formed to include n-type or p-type dopant atoms;
irradiating the metal layer with particles to move metal atoms from the metal layer into the semiconductor body and form a metal atom containing region in the semiconductor body, and to move at least some of the n-type or p-type dopant atoms from the metal layer into the semiconductor body; and
annealing the semiconductor body, wherein the annealing comprises heating at least the metal atom containing region to temperature of less than 500° C.,
wherein forming the metal layer to include the n-type or p-type dopant atoms comprises depositing the metal layer in an atmosphere that includes the n-type or p-type dopant atoms.

* * * * *